(12) United States Patent
Rogers et al.

(10) Patent No.: US 7,780,392 B2
(45) Date of Patent: Aug. 24, 2010

(54) HORIZONTAL ARRAY STOCKER

(75) Inventors: Theodore W. Rogers, Alameda, CA (US); Norma Riley, Durham, CA (US)

(73) Assignee: Muratec Automation Co., Ltd., Kyoto (JP)

( * ) Notice: Subject to any disclaimer, the term of this patent is extended or adjusted under 35 U.S.C. 154(b) by 190 days.

(21) Appl. No.: 11/588,962

(22) Filed: Oct. 27, 2006

(65) Prior Publication Data

US 2007/0134078 A1   Jun. 14, 2007

Related U.S. Application Data

(60) Provisional application No. 60/730,688, filed on Oct. 27, 2005.

(51) Int. Cl.
*B65G 1/00* (2006.01)

(52) U.S. Cl. .................. 414/267; 414/561; 414/626; 414/940

(58) Field of Classification Search .............. 414/267, 414/626, 266, 561, 268, 940
See application file for complete search history.

(56) References Cited

U.S. PATENT DOCUMENTS

| | | | | |
|---|---|---|---|---|
| 3,405,818 | A * | 10/1968 | Humenuk | 414/285 |
| 4,377,114 | A * | 3/1983 | Fuller | 108/103 |
| 5,059,079 | A | 10/1991 | Foulke et al. | |
| 5,980,183 | A * | 11/1999 | Fosnight | 414/222.01 |
| 6,011,998 | A * | 1/2000 | Lichti et al. | 700/230 |
| 6,336,546 | B1 * | 1/2002 | Lorenz | 198/346.2 |
| 6,468,021 | B1 | 10/2002 | Bonora et al. | |
| 6,579,052 | B1 | 6/2003 | Bonora et al. | |
| 6,604,624 | B2 * | 8/2003 | Hirata et al. | 198/494 |
| 2003/0077153 | A1 * | 4/2003 | Elliott et al. | 414/281 |
| 2003/0235486 | A1 * | 12/2003 | Doherty et al. | 414/217.1 |
| 2004/0126208 | A1 * | 7/2004 | Tawyer et al. | 414/222.02 |
| 2004/0265107 | A1 | 12/2004 | Kim et al. | |
| 2005/0191162 | A1 * | 9/2005 | Chang et al. | 414/626 |

FOREIGN PATENT DOCUMENTS

| | | |
|---|---|---|
| JP | 10 250836 | 9/1998 |
| JP | 2005 045157 | 2/2005 |
| JP | 2005 280929 | 10/2005 |
| WO | WO 98/46503 | 10/1998 |
| WO | WO 03/046954 | 6/2003 |

OTHER PUBLICATIONS

International Search Report.

* cited by examiner

*Primary Examiner*—Saúl J Rodríguez
*Assistant Examiner*—Jonathan D Snelting
(74) *Attorney, Agent, or Firm*—Fish & Richardson P.C.

(57) ABSTRACT

The present invention comprises a stocker. The stocker comprises multiple container storage locations arranged in a horizontal array. The horizontal array of storage locations may be suspended from the facility ceiling or supported by the facility floor. The stocker may include one or more stocker robots for transporting a workpiece container within the stocker and/or to a material transport system. The stocker may also include features such as container elevators and conveyor loops.

11 Claims, 8 Drawing Sheets

HORIZONTAL ARRAY STOCKER

CLAIM OF PRIORITY

This application claims priority under 35 U.S.C. §119(e) to U.S. Provisional Patent Application No. 60/730,688, entitled "Horizontal Array Stocker," which was filed with the U.S. Patent & Trademark Office on Oct. 27, 2005.

FIELD OF THE INVENTION

The present invention generally relates to a horizontal array stocker. More specifically, the present invention relates to stocker for storing wafer containers, for example, above tool bays in a single horizontal layer such that the stocker robot is able to move wafer containers throughout the stocker with minimal vertical motion.

BACKGROUND OF THE INVENTION

Conventional automated material handling systems used in semiconductor fabrication generally perform two basic functions: (1) storing material between processing steps, and (2) transporting material between storage locations and/or processing locations. Historically, the storage or stocking function has been accomplished by stacking horizontal rows of storage shelves vertically, as if attached to a flat, vertical wall, to provide a "vertical array" of storage locations, then providing a multi-axis robot which can move to each shelf location and place or remove a wafer carrier at that location. To increase robot utilization, a second wall of shelves is often provided on the opposite side of the robot from the first, and the robot can then access storage locations in either direction. Several input and output ports are typically provided within these walls of shelves to allow handoffs to the material transport system. These typically each consist of a secondary robot replacing several shelves, which can receive a wafer carrier from the primary stocker robot and move it through the wall of shelves to an exterior position where it can be accessed by the transport system.

FIG. 1 illustrates one embodiment of a conventional stocker 1 for storing semiconductor wafers 11 in cassettes 14 in storage bins 16. The stocker 1 includes a plurality of vertical rows 18 of storage bins 16, each of which can be accessed by a transport mechanism 20, including a rotatable elevator 22 on which a carriage 24 is mounted for vertical movement. The carriage 24 carries horizontally movable transport arms 26 for engaging the cassettes 14 under side lips 28 of the cassettes 14. Each vertical row 18 of the storage bins 16 includes a source of pressurized, particle-free air directed through a respective vertical distribution system 30. Such a stocker is disclosed in U.S. Pat. No. 5,059,079, entitled "Particle-Free Storage for Articles," which is assigned to Asyst Technologies, Inc., and is incorporated in its entirety herein.

This conventional stocker construction has several disadvantages. First, it requires a robot with a large moving mass and a large vertical range of motion, which in turn requires a heavy, expensive support structure and drive system. Second, this large mass limits the speed with which the robot can move, which limits how fast the robot can store or retrieve a wafer carrier. Third, the large mass of the robot base and shelf structures typically require them to be mounted on the clean room floor, increasing the total clean room floor space required for a given factory output. The cost of this additional clean room space often approaches the cost of the stocker itself.

Therefore, there is a need to store wafer containers in a horizontal array to reduce the mass of the stocking robot, reduce the required vertical travel through which the robot and carrier mass must be moved, to eliminate the need to provide additional clean room floor space for the purpose of wafer carrier storage, and to provide a larger number of input and output ports to the stocker.

SUMMARY OF THE INVENTION

One aspect of the present invention is to reduce and/or eliminate the stocker footprint in the fabrication facility. In one embodiment of the present invention, the horizontal array stocker is installed above the tool bay and is supported from the fabrication facility ceiling. Thus, the horizontal array stocker does not occupy any space on the fabrication facility floor. In another embodiment, the stocker is supported by the facility floor.

Another aspect of the present invention is to provide a stocker that can transport containers directly between itself and a material transport system. In one embodiment, the stocker includes a robot for transferring containers within the stocker and directly between the stocker and an interbay material transport system.

Still another aspect of the present invention is to provide a stocker that can transport a container between the stocker and a load port of a processing tool. In one embodiment, the stocker includes one or more container elevators for transporting a container directly between the stocker and a load port of a processing tool located below. In another embodiment, the stocker further includes one or more container elevators for transporting a container directly between the stocker and a material transport system located below.

Yet another aspect of the present invention is to reduce the complexity of the conventional stocker robot. In one embodiment of the present invention, the stocker robot comprises a conventional gantry robot. The gantry robot primarily moves horizontally along the X and Y directions with minimal motion along the Z axis. The Z motion required by the stocker robot is only necessary to lift a FOUP above the other FOUPs stored in the stocker (to avoid collisions).

Still another aspect of the present invention is to provide a stocker having more stocker input/output points than conventional stockers. In one embodiment of the present invention, the input/output ports are distributed along the length of a tool bay to enable faster delivery times and more effective buffering.

Yet another aspect of the present invention is to develop a flexible stocker architecture that may be used to store various types of carriers/containers, such as FOUPs, SMIF pods, single wafer containers, JDEC trays and the like.

DETAILED DESCRIPTION OF THE INVENTION

The Semiconductor Equipment and Materials Institute (SEMI) has created Standards for workpiece (e.g., semiconductor wafer) storage containers. Two examples of a workpiece storage container include a Front Opening Unified Pod (FOUP) for storing 300 mm wafers and a Standard Mechanical Interface (SMIF) pod for storing 200 mm wafers. Other type of workpiece storage containers exist, and a SMIF pod and/or FOUP may be sized to store any number of wafers and wafer of various sizes (e.g., 150 mm wafers, 450 mm wafers, etc.).

In general, a horizontal array stocker has not been contemplated within the semiconductor industry. Arranging the FOUP storage locations in a flat horizontal grid reduces the total height of the stocker (storage plus robot) to, in one embodiment, less than one meter. This lower height allows the horizontal array stocker to be installed in the currently unused space between the tallest process tools (typically 3 m high) and the ceiling of the fabrication facility (typically 4 m). Of course, the horizontal array stocker may comprise other heights.

For purposes of describing this invention, only FOUPs will be referenced herein. By way of example only, the various embodiments of the present invention may also be used and/or adapted for systems handling SMIF pods, reticle containers, flat panel display transport devices, or any other container or processing tool. Container is defined as any type of structure for supporting an article including, but not limited to, a semiconductor substrate. By way of example only, a container includes a structure that comprises an open volume whereby the article can be accessed (e.g., FPD transport) or a container having a mechanically openable door (e.g., bottom opening SMIF pod and FOUP).

In one embodiment, the horizontal array of FOUPs are packed/stored in a continuous grid of 400 mm×450 mm spaces. The configuration of storage locations is not, however, limited to this embodiment. The size of each storage location may be dependant on the type of containers that may be stored in the horizontal array stocker.

Figure 1:
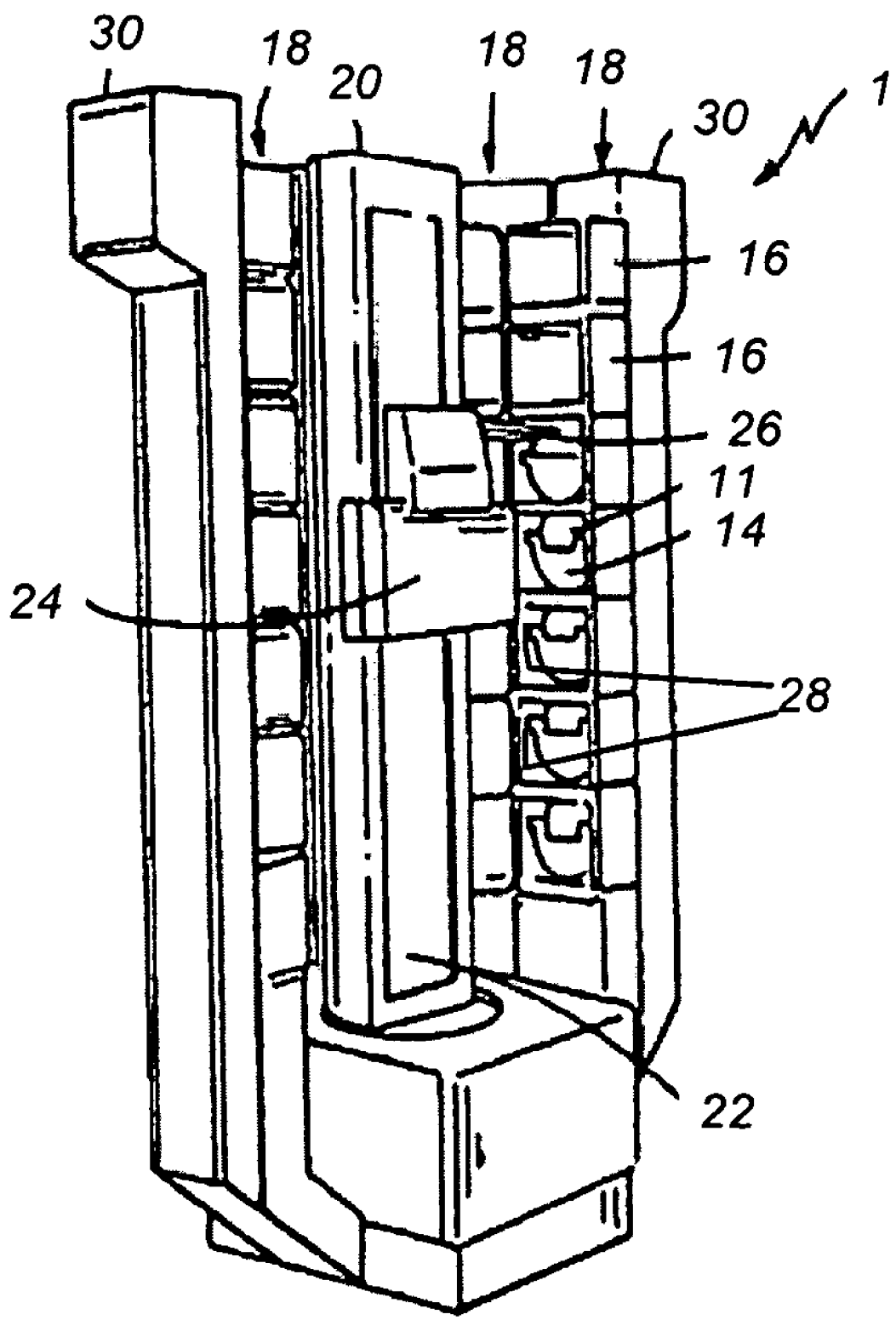
FIG. 1 is a perspective view of a conventional stocker, according to the prior art.
Figure 2:
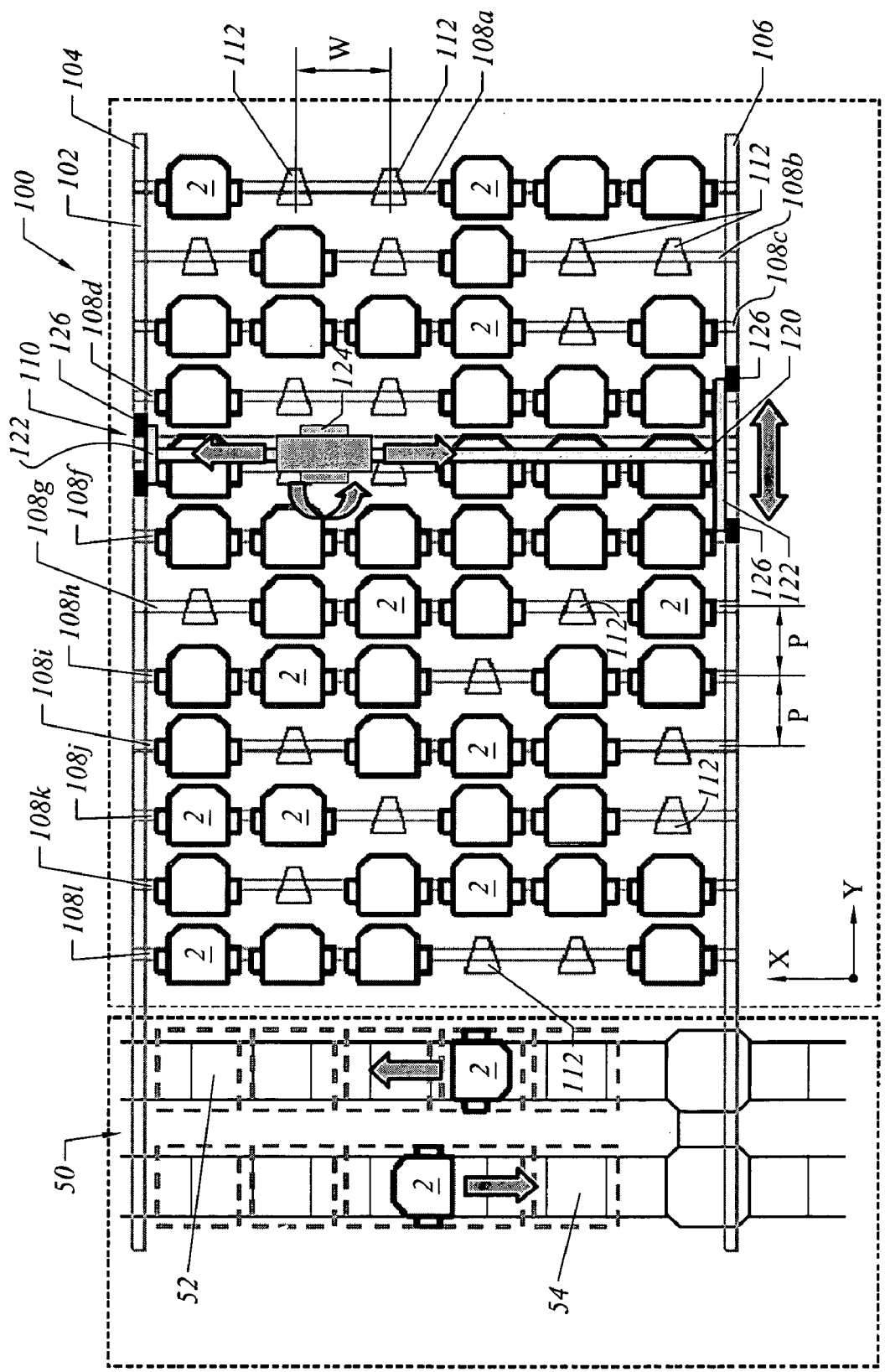
FIG. 2 is a schematic diagram of an embodiment of a horizontal array stocker.

FIG. 2 illustrates a horizontal array stocker 100 operating in conjunction with a material handling system 50. The material handling system 50 shown in FIG. 2 includes, among other things, a first interbay conveyor 52 and a second interbay conveyor 54. One example of a conveyor is disclosed in U.S. Pat. No. 6,494,308, entitled "Integrated Roller Transport Pod and Asynchronous Conveyor," which is assigned to Asyst Technologies, Inc., and is incorporated in its entirety herein.

The stocker 100 includes a frame 102, which in this embodiment, comprises a pair of guide rails 104, 106 connected by twelve, spaced apart support rails 108a-108l, and a container transport robot 110. The combination of the frame 102 and the robot 110 comprise a gantry structure for storing and transporting FOUPs 2 both within the stocker 100 and between the stocker 100 and the material transport system 50. As will be explained in more detail later, the stocker 100 and the material transport system 50 are preferably located at a similar elevation from the facility floor. But the stocker 100 and the material transport system 50 may be located at different elevations.

FIG. 2 illustrates that each of the twelve support rails 108 includes six storage locations 112. Each support rail 108 is not required to have the same number of storage locations 112. Each support rail 108 is also shown being a straight structure that is perpendicular to the guide rails 104, 106. The stocker 100 may include any number of support rails 108, and each support rail 108 may have any number of storage locations 112. For example, support rail 108a may include six storage locations 112, support rail 108b may include four storage locations 112, support rail 108c may include six storage locations 112 and so on. The stocker 100 may also include any number of support rails 108. In other words, the stocker 100 comprises a modular container storage system.

The storage locations 112 may comprise many different structures. FIG. 2 illustrates one embodiment of a storage location 112, which comprises a kinematic-like plate (e.g., includes registration features). A FOUP 2 rests on the plate while being stored in the stocker 100. The storage locations 112 may comprise other structures. It is also within the scope of the present invention for each storage location 112 to be integrated into the support rail 108 or comprise a separate component that is mounted to the support rail 108.

The stocker 100 comprises a six FOUP by twelve FOUP horizontal array of storage locations 112. Each support location or shelf 112 is spaced apart along a support rail 108 by a width W. And each support rail 108 is spaced apart by a pitch P. The width W between storage locations 112 and the pitch between support rails 108 may vary. The width W between storage locations 112 must be wide enough to prevent two FOUPs 2 seated adjacent each other from contacting each other. Similarly, the pitch P between support rails 108 must be large enough to prevent two adjacent FOUPs 2 from contacting each other.

The stocker robot 110, in this embodiment, comprises a gantry robot. The robot 110 includes a horizontal support 120 extending between a pair of movable supports 122, and a gripper mechanism 124. The movable supports 122, in this embodiment, include wheels 126 that movably support the robot 110 along the guide rails 104, 106. FIG. 2 illustrates that the base of each movable support 122 is not the same width. The movable support 122 traveling along the rail 106 has a wider base than the movable support 122 moving along the rail 104. The wider support 122 provides stability to the robot 110 and the second base 122 is primarily for guidance. Thus, the smaller or thinner support 122 saves material costs. The gripper mechanism 124 moves along the horizontal rail 120 and, in a preferred embodiment, may rotate about a theta axis. This type of gantry-style robot is known within the art and does not require further description. Motion parallel to the rails 104, 106 is referred to as the Y-axis. Motion parallel to the horizontal rail 120 is referred to as the X-axis.

There are many different types of drive systems that may operate the robot 110. By way of example only, the operation of the robot 100 may include a friction drive actuator, a rack and pinion actuator, or a belt drive actuator. Other drive systems are known within the robotic art and may be incorporated with the present invention. In addition, the robot 110 may include a single drive or include a drive in both supports. With two drives, the robot 110 would preferably include a controller for coordinating the y direction motion of each support 122.

Through a combination of motion along the X-axis and the Y-axis, the robot 110 may position the gripper 124 over any of the storage locations 112 in the stocker 100. At that point, the gripper 124 may then be lowered (Z-axis motion) to engage the FOUP 2 seated on the storage location 112. The FOUP 2 may be secured by gripping its top handle, side handles or any other means known within the art. The gripper 124 is then raised to lift the FOUP 2 from the storage location 112. A FOUP 2 must be raised higher than the top elevation of the other seated FOUPs before moving the gripped FOUP in the X direction or the Y direction. Otherwise, the gripped FOUP would contact a seated FOUP. Thus, the horizontal rail 120 is preferably located at a height that allows the gripper 124 to lift a FOUP 2 to such an elevation.

The robot 110 may also move a FOUP 2 between a storage location 112 and the material transport system 50. In this embodiment, the rails 104, 106 of the stocker frame 102 extend over the two conveyors 52, 54 so that the stocker robot 110 may travel over either of the conveyors 52 and 54 and position the gripper 124 accordingly. Similar to picking up a FOUP 2 from a storage location 112, the robot 110 positions the gripper 124 over one of the conveyors and then lowers the gripper 124 to engage and grip the FOUP 2. The gripper 124 is then raised, lifting the FOUP 2 off the conveyor to a particular elevation, and then the robot 110 moves along the rails 104, 106 and positions the FOUP 2 over a storage location 112. The robot 110 then lowers the gripper 124 until the FOUP 2 is seated on the storage location 112. In the FIG. 2 embodiment, the stocker robot 110 may pick up and drop off a FOUP 2 anywhere along the conveyors 50 or 52 that is located between the rails 104, 106 (as shown by hidden lines).

If the conveyors 52, 54 are located at a similar elevation as the storage locations 112, the robot 110 is able to move a FOUP the same vertical distance to pick up and drop off a FOUP regardless of whether the FOUP is located in the stocker 100 or on one of the conveyors 52, 54. Of course, the conveyors 52, 54 are not required to be located at the same elevation as the storage locations 112. The robot 110 may be programmed to travel a predetermined vertical distance when picking up/dropping off FOUPs located within the stocker 100 and a second predetermined vertical distance when picking up/dropping off FOUPs located within the material transport system 50.

Figure 3:
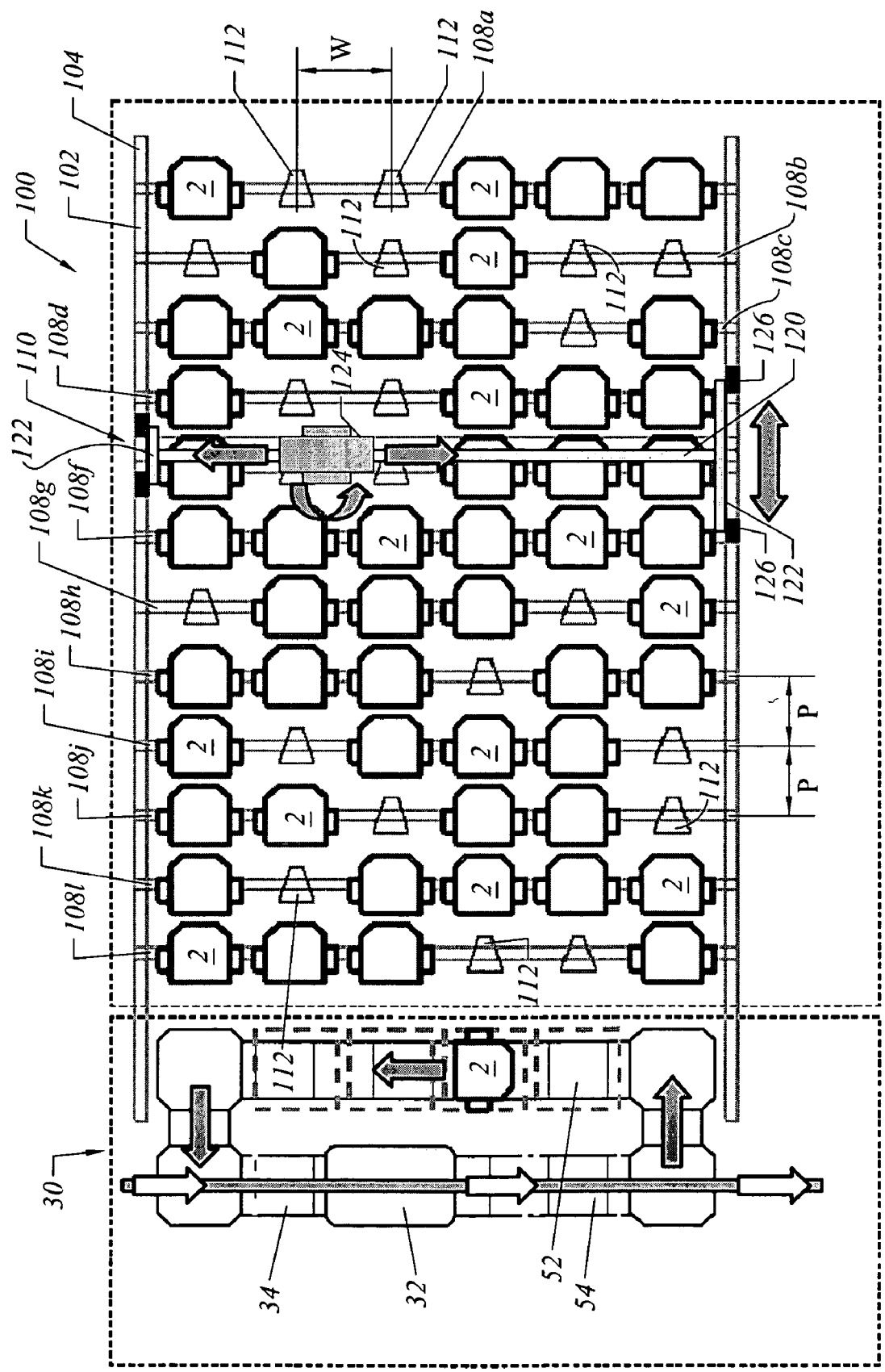
FIG. 3 is a schematic diagram of another embodiment of a horizontal array stocker.

FIG. 3 illustrates the stocker 100 in operation with a material handling system 30. The material handling system 30 includes a first conveyor 52, a second conveyor 54, four directors D and an overhead transport (OHT) system 34. Such a director is disclosed in U.S. Pat. No. 6,308,818 entitled "Transport System with Integrated Transport Carrier and Directors," which is assigned to Asyst Technologies, Inc., and is incorporated in its entirety herein. The OHT system 34, which includes an OHT shuttle 32, picks up and drops off FOUPs 2 onto the second conveyor 54. In FIG. 3, the rails 104, 106 of the stocker 100 extend only over the first conveyor 52. In one embodiment, the stocker robot 110 may pick up or drop off a FOUP 2 only onto the first conveyor 52 within the designated areas (shown by the hidden lines). In another embodiment, the OHT shuttle 32 comprises a side loading device that has the ability to transfer a FOUP 2 directly to the robot 110.

The horizontal array of storage locations 112 provides several advantages. The principal long-travel motions of the stocker robot 110 in a horizontal array stocker are in the horizontal X and Y directions (see FIG. 2). After placing or lifting a FOUP 2 from a storage location 112, moving the stocker robot 110 in the X and Y directions to move the FOUP within the stocker 100 avoids vertically accelerating both the mass of the stocker robot 110 and the FOUP 2 against gravity (e.g., in the Z direction) as is required in a convention stocker. This enables the stocker 100 to utilize, for example, a conventional gantry robot to transport FOUPs 2 within the stocker 100 or between the stocker 100 and a material transport system.

The gantry robot requires only a small range of vertical motion along the Z direction to, for example, lift a FOUP 2 from a storage location 112 until the bottom of the FOUP is located at an elevation higher than the top of a FOUP seated in another storage location. This way, a FOUP 2 transported by the robot 110 will not collide with another FOUP 2 seated in the stocker 100. In one embodiment, the stocker robot 110 includes a single-axis fail-safe gripper similar to the gripper mechanism used by Asyst's Fastload™ robot. However, the stocker robot is further simplified because the motion required to engage the FOUP handle is accomplished by moving the robot in either the X or Y direction, and not a separate axis or the gripper itself.

Another advantage of the stocker 100 is that each storage location 112 located around the perimeter of the stocker 100 may function as an input/output port. In contrast, the input/output port of a conventional stocker is typically limited to a small number of load ports. These additional input/output ports may be easily adapted to interface to a horizontal conveyor section or vertical conveyor sections (e.g., an elevator).

One possible location for a horizontal array stocker is above a tool bay. The horizontal array stocker, in this location, could, for example, span between tool fronts (e.g., over both the tool load ports and the center aisle; See FIG. 7) and extend along a portion of the length of the tool bay. The length of the horizontal array stocker depends on the number of FOUP storage locations 112. Placing a stocker in this location shortens the transport times between the stocker 100 and the tool bay conveyor (Or other material transport system), and provides more effective buffering features than a convention vertical array stocker. In this configuration, the horizontal array stocker could easily store, for example, 2-3 times more FOUPs than a conventional vertical array stocker. The horizontal array stocker also does not occupy any fabrication floor space.

Figure 4:
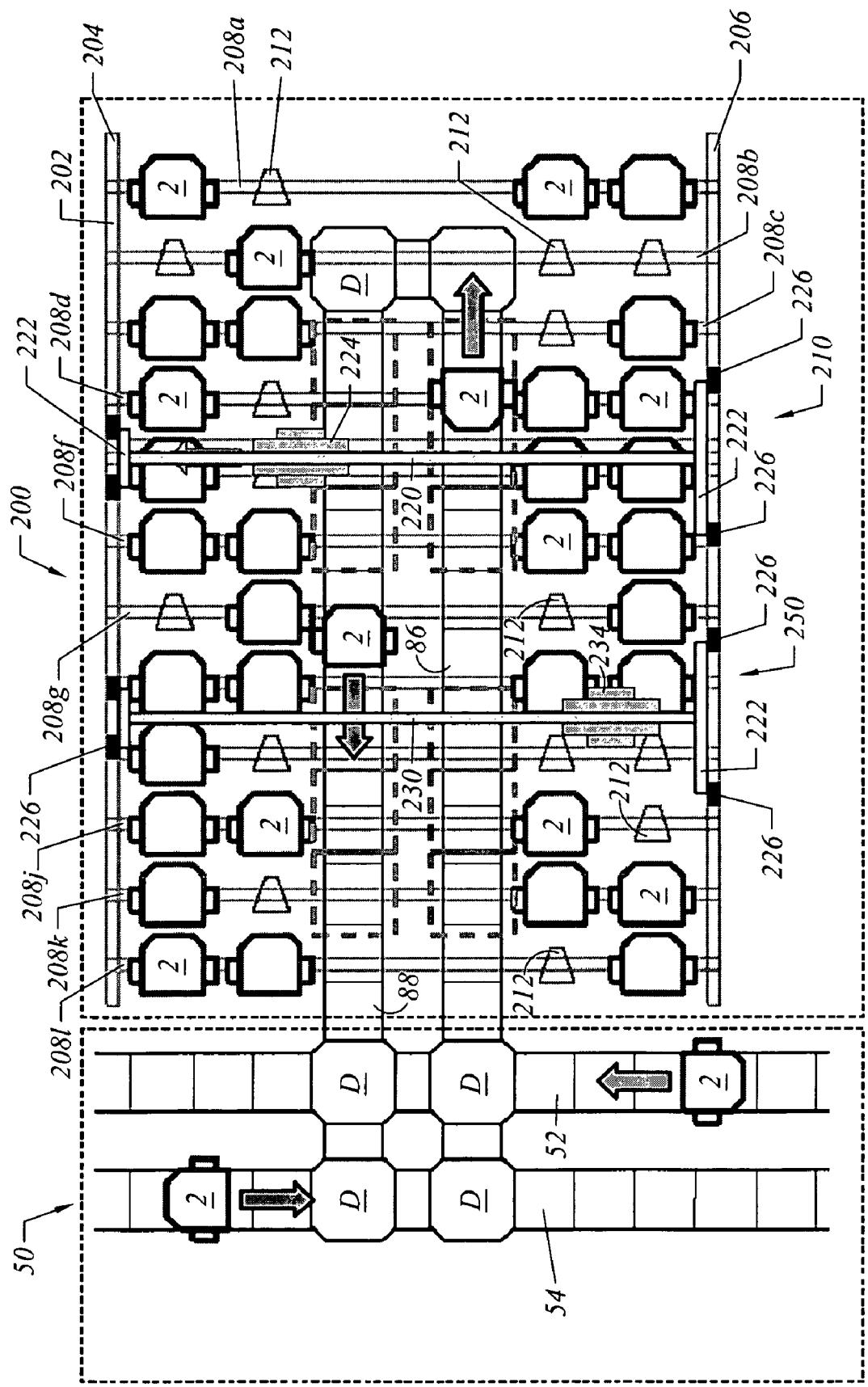
FIG. 4 is a schematic diagram of still another embodiment of a horizontal array stocker.

FIG. 4 illustrates a stocker 200 in operation with the material transport system 50. In this embodiment, the material transport system 50 includes a first conveyor 52, a second conveyor 54 and four directors D. The stocker 200 includes a frame 202 having a first rail 204, a second rail 206 and support rails 208*a*-208*l*. The stocker 200 also includes a first robot 210 and a second robot 250 for moving FOUPs 2 within the stocker 200. Both robots 210 and 250 operate in a similar manner as described above with regard to robot 110.

The stocker 200 includes a conveyor loop 80 that connects to the material transport system 50. The conveyor loop 80 includes an input conveyor 86 for receiving FOUPs from the first conveyor 52, an output conveyor 88 for moving FOUPs from within the stocker 200 to the first conveyor 52, a conveyor 90 for moving a FOUP 2 between the input conveyor 86 and the output conveyor 88 and two directors D. The conveyors 52, 54 are preferably located at the same elevation as the conveyor loop 80 so that a FOUP 2 may travel seamlessly between the material transport system 50 and the conveyor loop 80.

In this embodiment, the input conveyor 86 and the output conveyor 88 travel through a central section of the stocker 200. The conveyor loop 80 reduces the amount of storage space in the stocker 200. The stocker 200 has fewer storage locations 212 to make room for the input conveyor 86, the output conveyor 88 and the two directors D. For example, support rails 208*b*-208*l* only include four support locations 212 and only the support rail 208*a* includes six support locations 212. Thus, the stocker 200 may only store up to forty-six FOUPs at one time where the FIG. 3 configuration of the stocker 100 may store up to seventy-two FOUPs at one time.

Each support rail 208b-208l is shown traveling underneath the conveyor loop 80 so that none of the support rails 208b-208l obstruct a FOUP 2 traveling on the input conveyor 86, the output conveyor 88 or the conveyor 90. It is within the scope of the present invention to allow the support rails 208b-208l to extend underneath the conveyor loop 80, over the conveyor loop 80, or through the conveyor loop's support structure.

The stocker 200 shown in FIG. 4 also includes two robots 210, 250. For purposes of describing the stocker 200, only the operation of the robot 210 will be described. The stocker robot 210 comprises a gantry-like robot similar to the robot 110 described above, and includes a horizontal rail 220, a pair of movable supports 222 and a gripper mechanism 224. The movable supports 222 include wheels 226 that travel along the guide rails 204, 206. The gripper mechanism 224 moves along the horizontal rail 220. This type of gantry-style robot 200 is known within the art and does not require further description. The robot 250 may/may not be similar to the robot 210. In the embodiment illustrated in FIG. 4, the robot 250 is similar in structure to the robot 210 and includes a horizontal rail 220, a pair of movable supports 222 and a gripper mechanism 234. The movable supports 222 include wheels 226 that travel along the guide rails 204, 206. The gripper mechanism 234 moves along the horizontal rail 230.

The stocker 200 provides several advantages over the stocker 100. One advantage is that the stocker 200 moves FOUPs more efficiently than the stocker 100. The stocker 100 moves FOUPs from the material transport system 50 into the stocker 100 only as fast as the robot 110 is able to transport one FOUP at a time. The stocker 200 may accept FOUPs traveling in the material transport system 50 as often as the speed of the conveyor loop 80. For example, the input conveyor 86 may accept a FOUP 2 from the first conveyor 52 and immediately transport the FOUP 2 towards the back of the stocker 200. Doing so immediately makes room on the input conveyor 86 to accept another FOUP 2 from the material transport system 50. As the second FOUP is traveling down the input conveyor 86, the robot 210 may be placing the first FOUP in a storage location 212. The stocker 200 does not have to continually wait to bring another FOUP into the stocker until the robot 210 is available.

Another advantage of the stocker 200 is that, in a preferred method of operation, the stocker robot never has to move a FOUP 2 horizontally more than three locations. For example, a FOUP 2 traveling on the input conveyor 86 is preferably seated on a storage location 212 located between the input conveyor 86 and the rail 206. Similarly, a FOUP 2 traveling on the output conveyor 88 is preferably seated on a storage location 212 located between the output conveyor 88 and the rail 204. Under these circumstances, the robots 210 and 250 would not be required to move a FOUP 2 more than three spaces along the X-axis (e.g., from the input conveyor 86 to a storage location 212 adjacent the rail 206). FOUP transfer time is kept to a minimum by moving FOUPs short distances.

The operation of each stocker robot must be coordinated to avoid collisions between the robots 210 and 250. In one embodiment, each robot 210, 250 has a designated area for placing and picking up a FOUP 2 from the input conveyor 86 and the output conveyor 88 (as shown by the hidden lines). The designated pick up and drop off areas for each robot 210, 250 allow the stocker 200 to quickly and efficiently move FOUPs 2 within the stocker 200. A stocker controller coordinates the motion between the robots 210 and 250 to, among other things, prevent the robots 210, 250 from colliding together and coordinating the FOUP movement between a storage location 212 and a specific robot.

Figure 5:
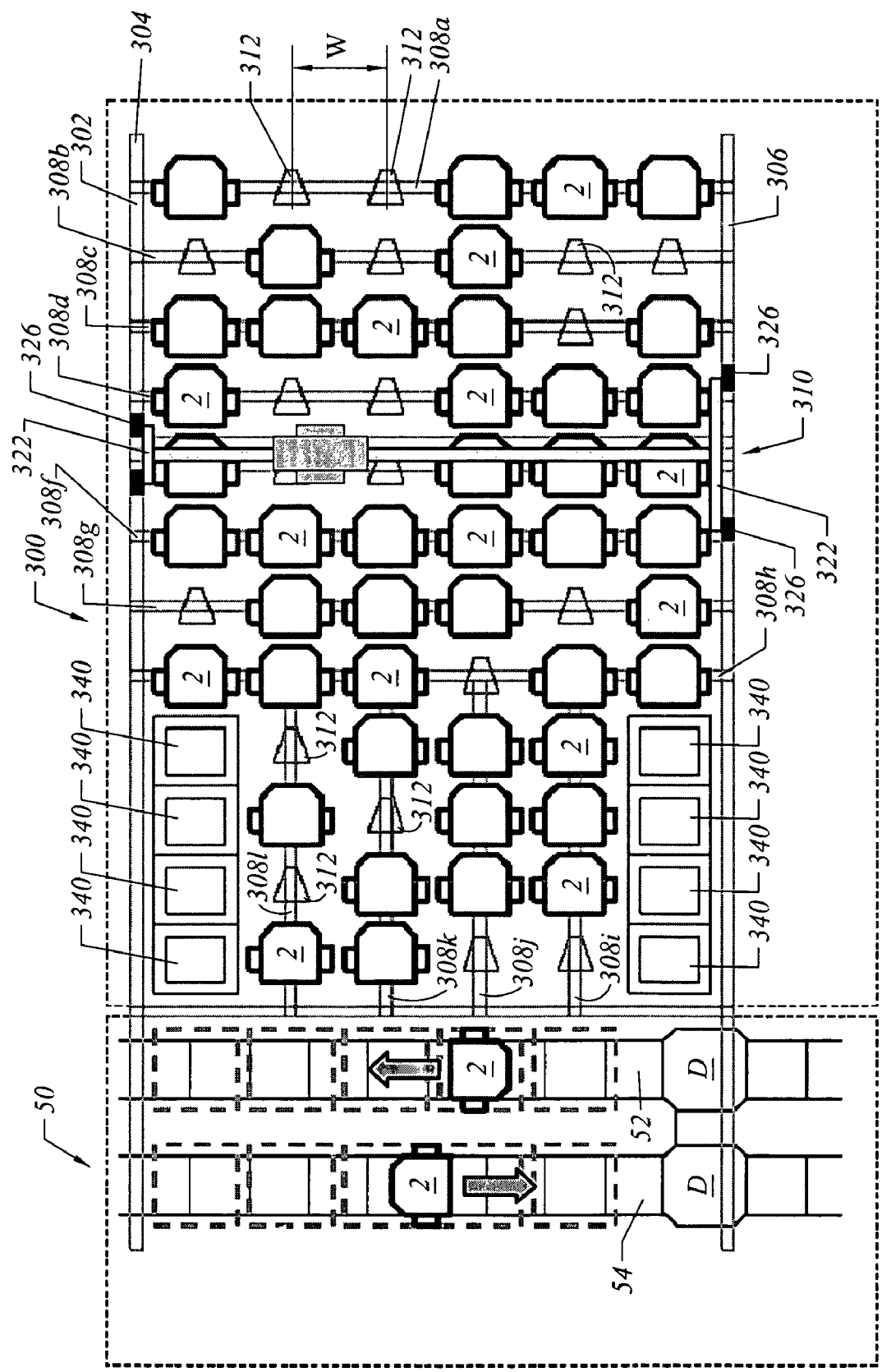
FIG. 5 is a schematic diagram of still another embodiment of a horizontal array stocker.

FIG. 5 illustrates a horizontal array stocker 300. The stocker 300 is shown in operation with a material transport system 50, which includes a first conveyor 52 and a second conveyor 54. The stocker 300 includes a frame 302 that includes two outer rails 304, 306. The outer rails 304, 306 are connected by eight support rails 308a-308h. An additional four support rails 308i-308l are each connected between the front of the frame 302 and the support rail 308h. In a preferred embodiment, the four support rails 308i-308l are aligned such that FOUPs seated on the storage locations 312 on each of the support rails support rails 308i-308l are in-line (along the X-axis and the Y-axis) with the other FOUPs stored in the stocker 300.

The stocker 300 includes eight container elevators 340. Each container elevator 340 may be located anywhere within the stocker 300 that is accessible by the stocker robot 310. The stocker robot 310 comprises a gantry-like robot similar to the robot described above with reference to FIG. 4, and includes a horizontal rail, a pair of movable supports 322 and a gripper mechanism. The movable supports 322 include wheels 326 that travel along the guide rails 304, 306. The gripper mechanism moves along the horizontal rail. The eight container elevators 340 are configured into two rows of four elevators, and each row is located in a front portion of the stocker and along the rails 304, 306. Each container elevator 340 transports a FOUP 2 between the stocker 300 and a conveyor located below the stocker 300 (not shown). When a FOUP 2 is brought into the stocker 300 by a container elevator 340, the FOUP 2 is preferably located at the same elevation as a FOUP 2 seated on one of the storage locations 312.

Maintaining all the FOUPs 2 at a similar elevation within the stocker 300 is preferable. One aspect of the robot 310 is to transport FOUPs within the stocker 300 between the storage locations 312 and to/from the elevators 340. If all FOUPs within the stocker 300 are located at a similar elevation, the robot 310 may be programmed to move a uniform vertical distance to engage any of the FOUPs stored within the stocker 300 regardless of whether the FOUP 2 is seated on a storage location 312 or an elevator 340.

The outer rails 304, 306 of the stocker 300 extend over the first conveyor 52 and the second conveyor 54. In addition to moving FOUPs 2 within the stocker 300, the robot 310 may therefore transport FOUPs 2 between the stocker 300 and the material transport system 50. The rails 304, 306 are not required to extend over both conveyors 52 and 54. For example, the rails 304, 306 may extend over only the first conveyor 52.

Figure 6:
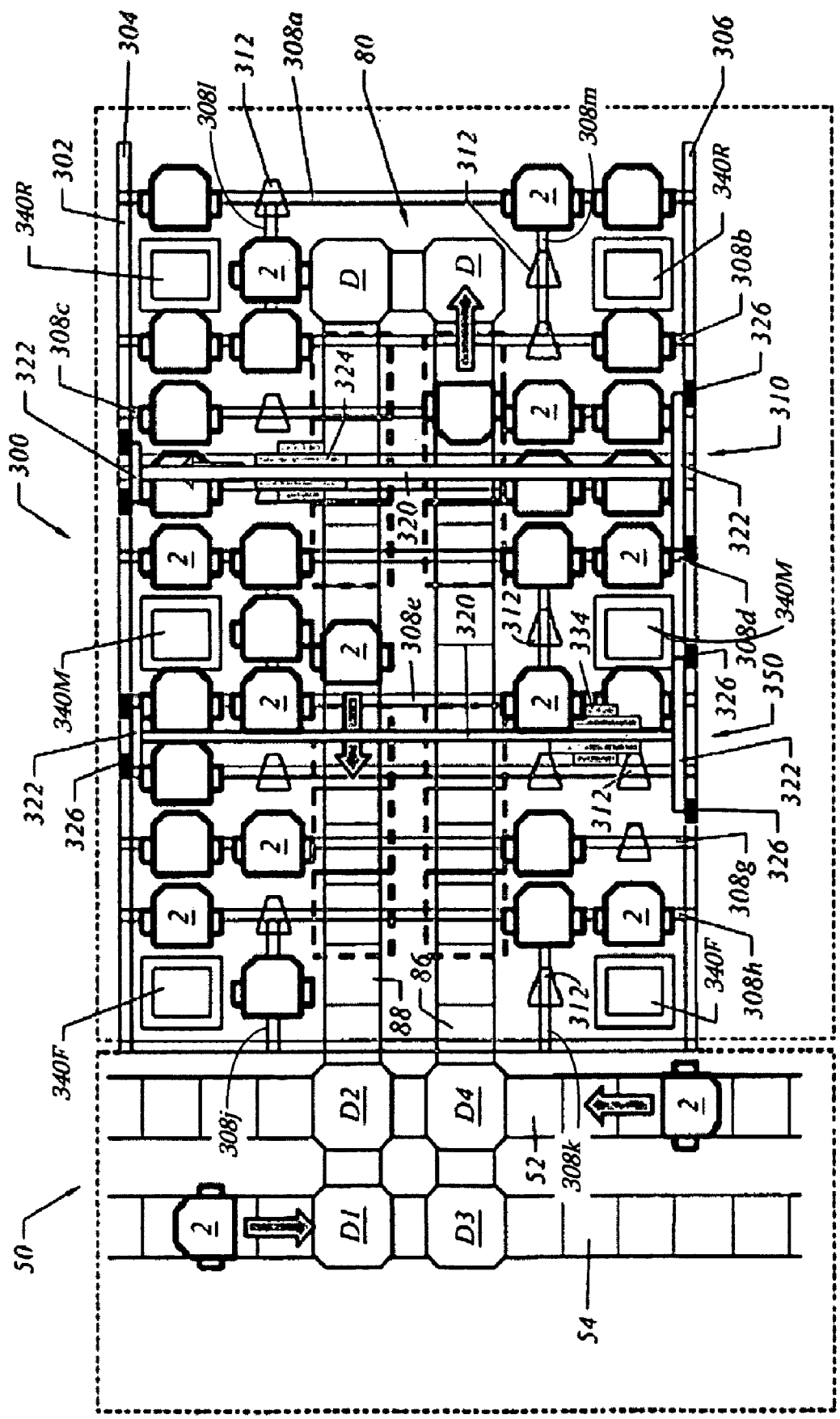
FIG. 6 is a schematic diagram of yet another embodiment of a horizontal array stocker.

FIG. 6 illustrates another configuration of the stocker 300. In the FIG. 6 embodiment, the stocker 300 includes a conveyor loop 80 and six container elevators 340. The conveyor loop 80 connects to a material transport system 50 that includes a first conveyor 52, a second conveyor 54 and four directors D1-D4. The conveyor loop 80 includes an input conveyor 86, an output conveyor 88 and two directors D. The directors D preferably rotate the FOUP 2 so that the FOUP door always faces the direction of travel. The stocker 300 includes a frame 302 that includes guide rails 304, 306 and support rails 308a-308i connecting the rails 304, 306. Support rails 308a-308i preferably extend below the input conveyor 86 and the output conveyor 88. To maximize the storage capacity of the stocker 300, four storage locations 312 have been added in what would otherwise be an empty space. Support rails 308j-308m comprise shorter support rails within the frame 302 for supporting a single support location 312. For example, support rail 308m includes one support location 312 and extends between support rails 308a and 308b.

The stocker 300 includes six container elevators 340. Two container elevators 340F are located near the front of the stocker 300, two container elevators 340M are located at the midpoint of the stocker 300 and two container elevators 340R are located near the rear of the stocker 300. Each container elevator 340 is located adjacent an outer rail. Spacing the container elevators 340 apart within the stocker 300 provides several advantages. One advantage is that the robot 310 does not have to move every FOUP 2 to the front section of the stocker 300 to reach an elevator 340, as is required in the FIG. 5 configuration of the stocker. If a FOUP 2 is seated along the support rail 308a, the robot 310 may transport the FOUP 2 to either of the elevators 340R. Similarly, the robot 310 can transport a FOUP 2 seated along the support rail 308d to either elevator 340M. The FIG. 6 configuration of the stocker 300 is therefore more efficient than the FIG. 5 embodiment of the stocker.

FIG. 6 illustrates that the stocker 300 includes two stocker robots 310 and 350. It is within the scope of the invention for the stocker 300 to only include a single robot. The stocker robots 310 and 350 include a horizontal rail 320, a pair of movable supports 322 and a gripper mechanism 324 and 334, respectively. The movable supports 322 include wheels 326 that travel along the guide rails 304, 306. The gripper mechanism 324, 334 move along the horizontal rail 320. To increase efficiency of the stocker 300 further, the stocker 300 is divided into two sections (e.g., front and rear sections) and the robots 310 and 350 move FOUPs only within a particular section. For example, robot 310 is responsible for moving FOUPs between storage locations 312 located along support rails 308a-308d and the elevators 340 and conveyors 86 and 88 within the same range. And robot 350 is responsible for moving FOUPs between the remaining storage locations 312 elevators 340 and sections of the conveyors 86 and 88. The robots 310, 350 may both be able to access the elevators 340M. In this case, a controller preferably coordinates the motion of the robots 310, 350 to ensure that the robots do not collide during operation.

Figure 7:
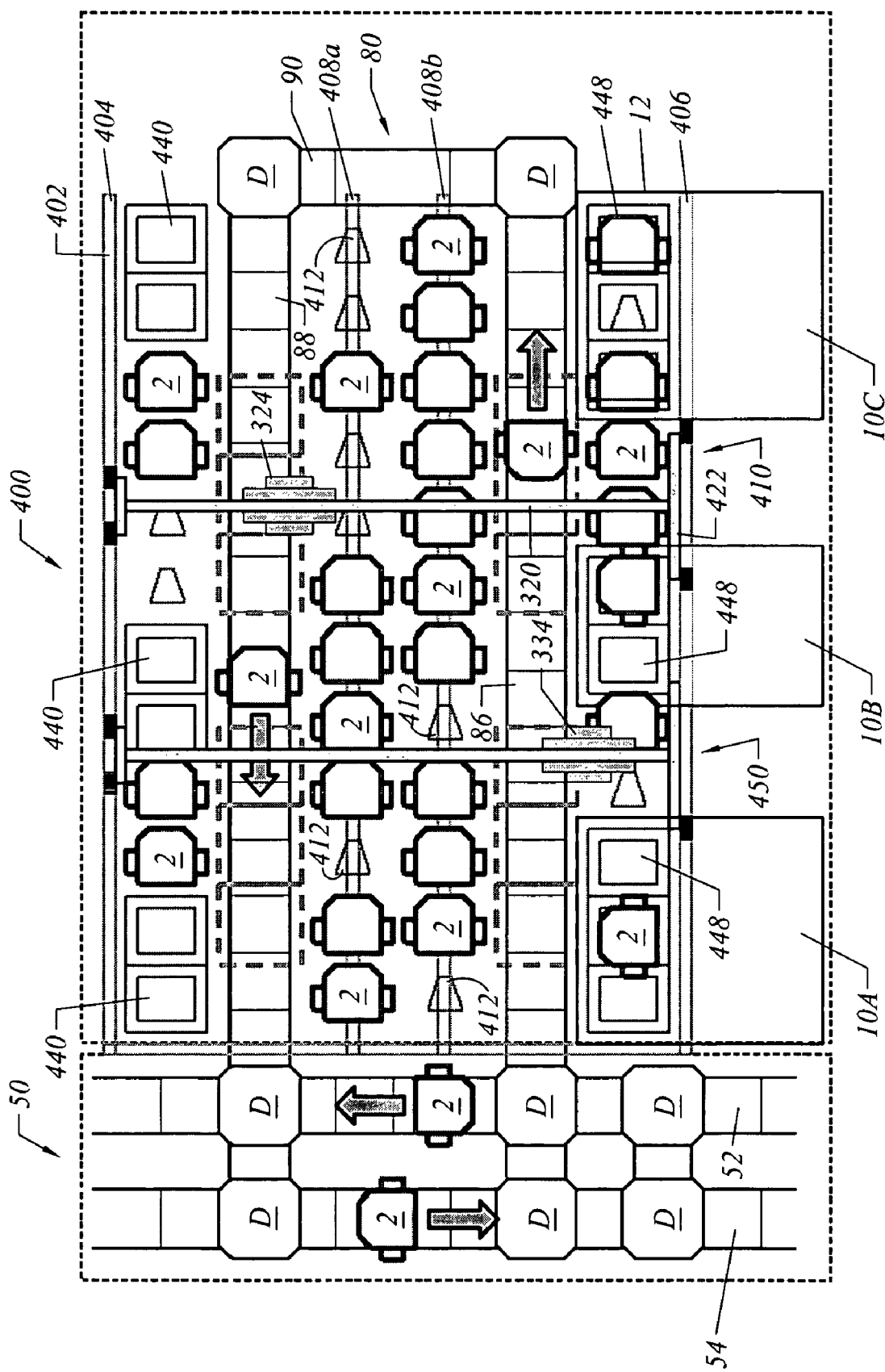
FIG. 7 is a schematic diagram of still another embodiment of a horizontal array stocker.

FIG. 7 illustrates a horizontal array stocker 400 in operation with a material transport system 50. In this embodiment, the stocker 400 includes a frame 402, support rails 408, storage locations 412, elevators 440, elevators 448, a first robot 410 a second robot 450 and a conveyor loop 80. The stocker 400 includes a two FOUP×twelve FOUP array of storage location 412 located in the central portion of the stocker 400. The conveyor loop 80, which includes an input conveyor 86 and an output conveyor 88, allows FOUPs 2 to travel around the 2×12 central array of storage locations 412. In a preferred embodiment, the input conveyor 86, the output conveyor 88 and the conveyors 52 and 54 of the material transport system 50 are located at substantially the same elevation. This way, a FOUP 2 may travel between the stocker 400 and the material transport system 50 without requiring a robot to move the FOUP 2 between two systems located at two different elevations.

FIG. 7 illustrates that the horizontal array stocker 400 may be placed or installed within a tool bay in any overhead space in the fabrication facility that is available. For example, the available overhead space may be located in a tool bay, over process tools, in a hallway or walkway and so on. In fabrication facilities with taller ceilings (e.g., greater than 4 m high), or if the stocker is for storing single workpiece containers (e.g., reticle pods, single wafer pods, JDEC trays, etc.), multiple horizontal stocker arrays may be able to fit within the overhead space; creating even more FOUP storage in currently underutilized spaces.

Elevators 440 and 448 and additional storage locations 412 are located along the perimeter of the stocker 400. For example, to increase storage capacity of the stocker 400, additional storage locations 412 are located between the rail 404 and the output conveyor 88 and the rail 406 and the input conveyor 86. Interspersed between the storage locations 412, the stocker 400 includes several container elevators 440 and 448. In the FIG. 7 embodiment, the horizontal array stocker 400 is located within the tool bay such that several container elevators 440 are located substantially over the load port 12 of each processing tool 10A, 10B and 10C. The horizontal array stocker 400 maximizes the storage space above the tool bay by having storage locations 412 located between each process tool 10 and in between the container elevators 448. The elevators 440 located between the rail 404 and the output conveyor 88 may, for example, transport a FOUP 2 directly between the stocker 400 and a floor-base material transport system below (not shown) such as a conveyor, an automated transport vehicle, rail guided vehicle, and any other transport system known within the material transportation art. The elevators 448 located between the rail 406 and the input conveyor 86 may, for example, transport a FOUP 2 directly between the stocker 400 and the tool load port 12 below.

FIG. 7 illustrates that the horizontal array stocker 400 includes two stocker robots 410 and 450. The stocker robots 410 and 450 transport FOUPs 2 within the stocker 400 between storage locations 412, elevators 440, 448, the input conveyor 86, the output conveyor 88 and the conveyor 90. One or more controllers coordinates the operation of the robots 410, 450, the conveyor loop 80 and the elevators 440, 448. The robots 410 and 450 include a horizontal rail, a pair of movable supports 422 and a gripper mechanism 324 and 334, respectively. The movable supports 422 include wheels that travel along the guide rails 404, 406. The gripper mechanism 324, 334 move along the horizontal rail. In one embodiment, each robot has a designated area for lifting/placing FOUPs onto the conveyors to avoid collisions between the two robots (shown by the hidden lines). As discussed above, it is within the scope of this invention for the horizontal array stocker 400 to include only a single stocker robot.

Figure 8:
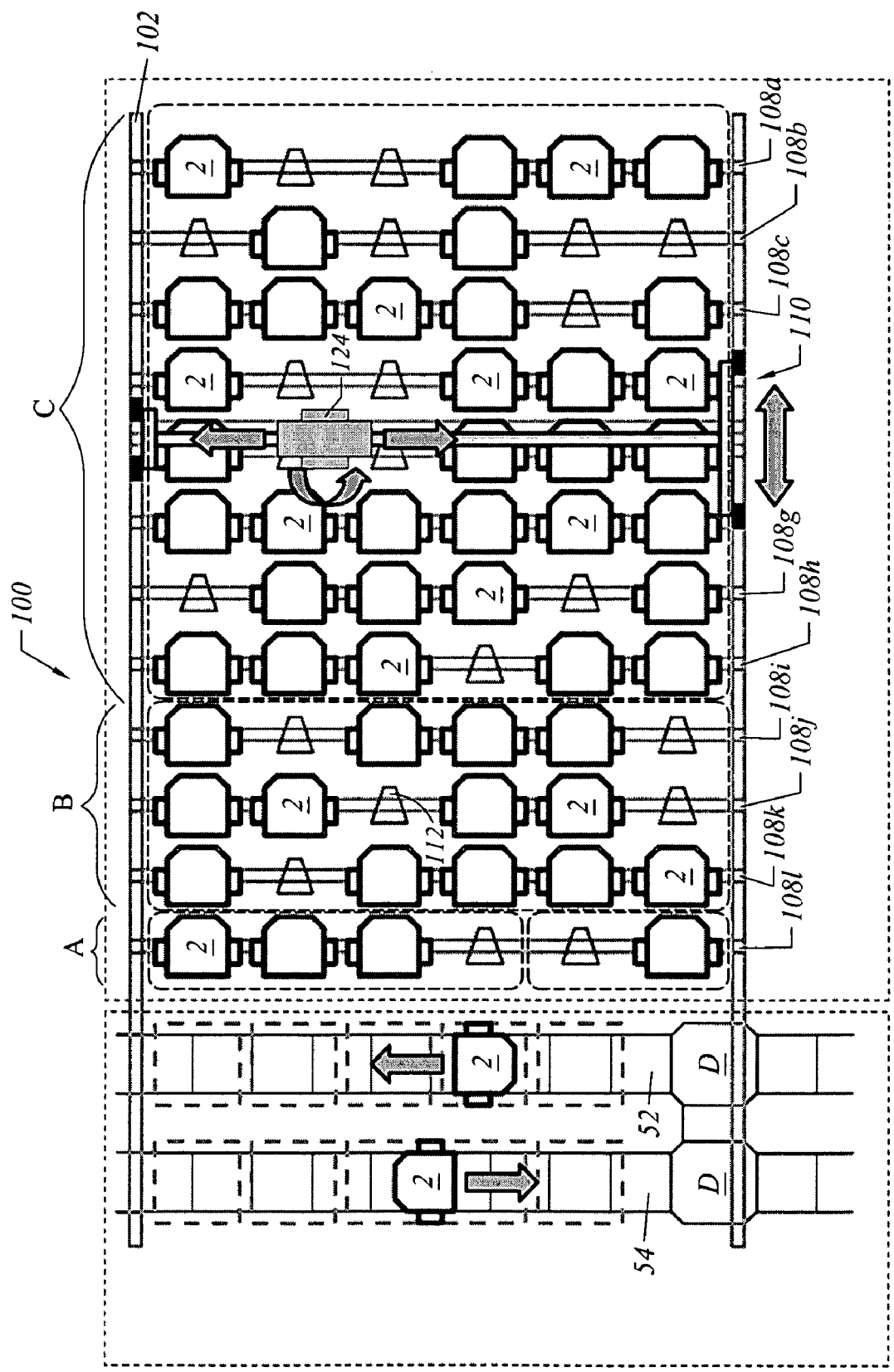
FIG. 8 is a schematic diagram of the FIG. 2 embodiment of the horizontal array stocker, illustrating storage regions of the stocker.

FIG. 8 illustrates that a stocker may include distinct storage regions, A, B and C. For example, the back section C of the stocker 100 (e.g., furthest away from the material transport system 50) may be used to store FOUPs 2 for long term storage. The front section A of the stocker 100 (e.g., closest to the material transport system 50) may be used to store FOUPs 2 for only a short term as a wafers-in-process storage area and the mid section B of the stocker 100 to store FOUPs 2 for a time period between long term and short term. In the situation where the stocker 100 includes only one stocker robot 100, as shown in FIG. 8, FOUPs stored in the back section C of the stocker 100 take longer to transport from within the stocker to one of the drop-off/pick-up ports on the first conveyor 52 (shown by hidden lines). The first row, or section A of the stocker 100, in this embodiment, is reserved for outbound hot lots for quick and easy access to the FOUPs. Of course, any of the features shown in FIGS. 2-8 may be incorporated into this horizontal array stocker.

As discussed above (see FIGS. 4 and 6), the horizontal array stocker may be sub-divided into different regions by using multiple gantry robots to access the FOUPs stored in the stocker. Adding multiple input/output ports, in combination with multiple stocker robots, provides rapid access to wafers-in-process (WIP) needed anywhere in the tool bay. The stocker robot, of course, may include more than one gripper and/or Z-arm to rapidly swap FOUPs at a single storage or input/output location.

As discussed above, the storage location for each FOUP 2 in the stocker may be based on its lot priority. For example, the stocker 100 may place a FOUP 2 with the shortest expected dwell time in the stocker 100 in a storage location 112 with the shortest expected transport time to an output port that connects to the material transport system next expected to transport the FOUP 2. In the FIG. 8 embodiment, such a FOUP 2 would be placed in a storage location 112 within section A. A FOUP 2 seated within section A may be quickly transported out of the stocker 100 and to the material transport system 50. In the FIG. 7 embodiment, such a FOUP 2 could be placed in several different storage locations 412 within the stocker 400. The stocker 400 includes several output ports—storage locations 412 adjacent the elevators 440 for transporting a FOUP 2 directly to a process tool 10, storage locations 412 adjacent the elevators 440 for transporting a FOUP 2 to a material transport system located below the stocker 400 and storage locations 412 located near the front of the stocker 400 whereby a FOUP 2 may be quickly transported to the material transport system 50.

If the concept of selecting storage locations by lot priority is applied to the horizontal array stocker in a configuration where, by means of elevators or other local material transport system, FOUPs may be rapidly transported from a storage location within the stocker to a nearby process tool, the horizontal array stocker may further be applied to provide local buffering for individual process tools or tool groups. Importantly, in such a configuration the horizontal array stocker may serve both bulk storage and local tool buffering functions simultaneously. This capability is not well provided by any other FOUP storage solution currently in use.

Altering storage location spacing (and thus volume used) to stock other types of carriers in a vertical array stocker would require substantial re-design of the stocker structure. The horizontal array stocker, however, may be adapted to store various types of carriers, such as reticle pods or JDEC trays used in back-end semiconductor processing, by altering only the storage grid and registration points.

It should be appreciated that the above-described embodiments of a stocker are for explanatory purposes only and that the invention is not limited thereby. Having thus described preferred embodiments of a stocker, it should be apparent to those skilled in the art that certain advantages of the within system have been achieved. It should also be appreciated that various modifications, adaptations, and alternative embodiments thereof may be made within the scope and spirit of the present invention. For example, the stocker has been illustrated in a semiconductor fabrication facility, but it should be apparent that many of the inventive concepts described above would be equally applicable to the use of other non-semiconductor manufacturing applications.

We claim:

1. In a fabrication facility comprising a material transport system elevated between a facility floor and a facility ceiling, a stocker for storing one or more workpiece containers, the stocker comprising:
   one or more elongate, first support rails, each of the one or more elongate, first support rails comprising a plurality of storage locations configured to support the one or more workpiece containers;
   the plurality of storage locations arranged in a horizontal array comprising at least two rows and two columns of storage locations;
   a conveyor loop comprising an input conveyor and an output conveyor, the input conveyor configured to receive the one or more workpiece containers from the material transport system and the output conveyor configured to transport the one or more workpiece containers from within the stocker to the material transport system;
   a second support rail connected to a pair of guide rails, wherein the second support rail is located in a substantially horizontal plane defined by a space between the pair of guide rails and wherein the second support rail is parallel to and located above the one or more elongate, first support rails;
   a container transport robot mounted to the second support rail, the container transport robot configured to transport the one or more workpiece containers in a substantially parallel direction relative to the substantially horizontal plane defined by the space between the pair of guide rails,
   wherein the one or more workpiece containers are stored at the stocker in distinct storage regions based on a priority associated with the one or more workpiece containers,
   wherein each of the one or more elongate, first support rails extends along a length defined by a x-axis of the substantially horizontal plane defined by the space between the pair of guide rails, and
   wherein each of the one or more elongate, first support rails comprises a longitudinal axis disposed parallel to the x-axis of the substantially horizontal plane defined by the space between the pair of guide rails.

2. The stocker of claim 1, wherein the conveyor loop is configured to transport the one or more workpiece containers through a central portion of the stocker.

3. The stocker of claim 1, wherein a particular storage location comprises a storage shelf comprising registration features.

4. The stocker of claim 1, wherein the container transport robot is configured to transport the one or more workpiece containers between any of the plurality of storage locations, the conveyor loop and the material transport system.

5. The stocker of claim 1, wherein the container transport robot comprises a gantry robot.

6. The stocker of claim 1, wherein the plurality of storage locations arranged in the horizontal array are affixed by a frame.

7. The stocker of claim 6, wherein the frame is configured to be suspended from the facility ceiling.

8. The stocker of claim 6, wherein the frame is configured to be supported by the facility floor.

9. The stocker of claim 1, wherein the material transport system comprises a first material transport system and wherein the stocker further comprises:
   a workpiece container elevator configured to transport the one or more workpiece containers between the stocker and one of a process tool and a second material transport system.

10. The stocker of claim 1, wherein each of the storage locations in the plurality of storage locations that is located along a perimeter of the stocker is configured to perform one or more of loading and unloading the one or more workpiece containers.

11. The stocker of claim 1, wherein the stocker is configured to provide local buffering for a process tool.

* * * * *

UNITED STATES PATENT AND TRADEMARK OFFICE
CERTIFICATE OF CORRECTION

| | | |
|---|---|---|
| PATENT NO. | : 7,780,392 B2 | Page 1 of 1 |
| APPLICATION NO. | : 11/588962 | |
| DATED | : August 24, 2010 | |
| INVENTOR(S) | : Rogers et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 234 days.

Signed and Sealed this
Fourth Day of January, 2011

David J. Kappos
*Director of the United States Patent and Trademark Office*